United States Patent
Candage

[19]

[11] Patent Number: 5,987,065
[45] Date of Patent: Nov. 16, 1999

[54] ADAPTIVE EQUALIZER

[75] Inventor: Anthony B. Candage, Port Moody, Canada

[73] Assignee: PMC-Sierra Ltd., Burnaby, Canada

[21] Appl. No.: 08/882,154

[22] Filed: Jun. 25, 1997

[51] Int. Cl.$^6$ .............. H03H 7/30; H03H 7/40; H03K 5/159

[52] U.S. Cl. .............. 375/232; 333/28 R; 333/28 T; 381/103

[58] Field of Search .............. 375/232, 229, 375/230; 333/28 R, 28 T; 708/323; 381/103

[56] References Cited

U.S. PATENT DOCUMENTS

| | | | |
|---|---|---|---|
| 4,413,240 | 11/1983 | Dyke | 333/17 R |
| 5,530,769 | 6/1996 | Saitoh | 381/103 |
| 5,828,700 | 10/1998 | Korn | 375/232 |
| 5,892,833 | 4/1999 | Maag et al. | 381/98 |

Primary Examiner—Stephen Chin
Assistant Examiner—Mohammad Ghayour
Attorney, Agent, or Firm—Pascal & Associates

[57] ABSTRACT

An equalizer comprising a pair of high pass filters for receiving an input signal, each filter having gain, a first of the filters having gain which is substantially flat within its passband, a second of the filters having gain over a range of its passband which is controlled by an error signal, a differential amplifier for generating the error signal, having an output applied to a control input of the second filter, a pair of broadband amplitude peak detectors each for receiving an output signal of a respective one of the filters, apparatus for applying loop signals derived from outputs of the filters and passing though the peak detectors to corresponding inputs of the differential amplifier, apparatus for providing an offset to a loop signal derived from the output of the first filter, and apparatus for providing an output signal from the output of the second filter.

11 Claims, 4 Drawing Sheets

ADAPTIVE EQUALIZER

FIELD OF THE INVENTION

This invention relates to the field of signal transmission and in particular to an equalizer for data signals carried by lossy media.

BACKGROUND TO THE INVENTION

Data signals carried by lossy media such as twisted-pair copper wire are subject to amplitude and phase distortions which are frequency and cable length dependent. Uncompensated, this results in both amplitude and timing jitter, such as intersymbol interference, (ISI) which imposes practical limitations on the attainable bit error rate (BER) performance after reception. Amplitude and phase equalization is typically employed to correct the distortions.

Adaptive receiver equalization techniques have been employed in the highest speed data communications networks such as ATM (155 MBits/s), 100BaseTX Ethernet (100 MBits/s) and FDDI TP-PMD (Twisted-Pair FDDI, 100 Mbits/s) to allow for transmission on up to 100 m of Category 5 Unshielded Twisted-Pair (UTP5) and Shielded Twisted-Pair (STP) at BERs exceeding $10E^{-10}$ with radiated emissions within FCC Class A and Class B limited.

Many, if not all, available solutions for receiver adaptive equalization use the received voltage amplitude and a fixed amplitude reference to control equalization. Given a tight tolerance on the transmitted amplitude and fixed amplitude reference proper equalization can be attained. However performance is degraded as tolerances increase.

Because of the required transformers for system isolation and radio frequency emission control, baseline wander degrades performance as well, if transmitted data is not strictly balanced. If positive or negative peak detection schemes are used to extract amplitude information, baseline wander will cause an apparatus shift in received amplitude thereby introducing an error in the required equalization. If equalization is fixed, the baseline wander will not impact equalization but will reduce the decision threshold noise margins at the data quantizer, impacting BER performance.

In data communication systems which are subject to large baseline wander components, baseline wander correction is required to maintain the required BER. However, even small residue errors in this correction circuit can introduce an amplitude error into the adaptive equalizer path which can degrade performance.

SUMMARY OF THE INVENTION

The present invention is a method and apparatus for proper adaptive control of equalization with superior baseline wander tolerance. When a closed control loop is employed for baseline wander correction, the present invention prevents the two control loops from destructively interacting. The present invention also provides much improved immunity to received amplitude tolerances.

The present invention uses only the received signal to extract both the reference amplitude and the post-equalized peak amplitude. This could be made because I recognized that the contrast between high and low frequency data amplitudes contains much of the information required for proper equalization.

As a result, a line equalizer can be made robustly adaptive, with reduced sensitivity to received amplitude. The adaptive equalizer's sensitivity to baseline wander components have been substantially eliminated to a first order.

In accordance with an embodiment of the invention, a method of equalizing comprises applying an error signal to one of a pair of amplifiers having similar high pass bandwidths and which carry a similar input signal, for controlling high frequency gain of the one of the amplifiers, deriving the error signal by subtracting an amplitude value of a signal output from the one of the amplifiers and an offset amplitude value of a signal output from another of the amplifiers, and obtaining an output signal from the one of the amplifiers.

In accordance with another embodiment of the invention, an equalizer comprises (a) a pair of variable boost amplifiers, both for receiving an input signal, (b) a pair of circuit paths connected to respective outputs of the amplifiers, including apparatus for acquiring signal amplitudes of output signals from the amplifiers, (c) a differential amplifier for receiving the amplitudes at respective inputs thereof, and for providing an error signal to a gain control input of one of the amplifiers for controlling high frequency gain of the one of the amplifiers, (d) apparatus for providing an offset to one of the amplitudes, and (e) apparatus for providing an output signal from the output of the one of the amplifiers.

In accordance with another embodiment of the invention, an equalizer comprises: (a) a pair of high pass filters for receiving an input signal, each filter having gain, a first of the filters having gain which is substantially flat within its passband, a second of the filters having gain over a range of its passband which is controlled by an error signal, (b) a differential amplifier for generating the error signal, having an output applied to a control input of the second filter, (c) a pair of broadband amplitude peak detectors each for receiving an output signal of a respective one of the filters, (d) apparatus for applying loop signals derived from outputs of the filters and passing though the peak detectors to corresponding inputs of the differential amplifier, (e) apparatus for providing an offset to a loop signal derived from the output of the first filter, and (f) apparatus for providing an output signal from the output of the second filter.

BRIEF INTRODUCTION TO THE DRAWINGS

A better understanding of the invention will be obtained by considering the detailed description below, with reference to the following drawings, in which:

FIG. 1A is a block diagram of an environment in which the present invention can be used, FIG. 1B is a block diagram of an embodiment of the present invention, FIG. 2 is a graph of attenuation vs frequency of a typical unequalized cable, FIG. 3 is a graph of normalized magnitude vs frequency of an equalizer in accordance with an embodiment of the present invention, and FIG. 4 is a graph of attenuation vs frequency of a cable equalized in accordance with an embodiment of the present invention.

DETAILED DESCRIPTION OF THE PRESENT INVENTION

Figure 1A:
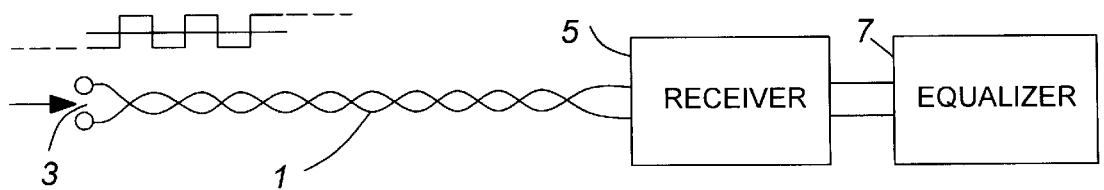
Figure 2:
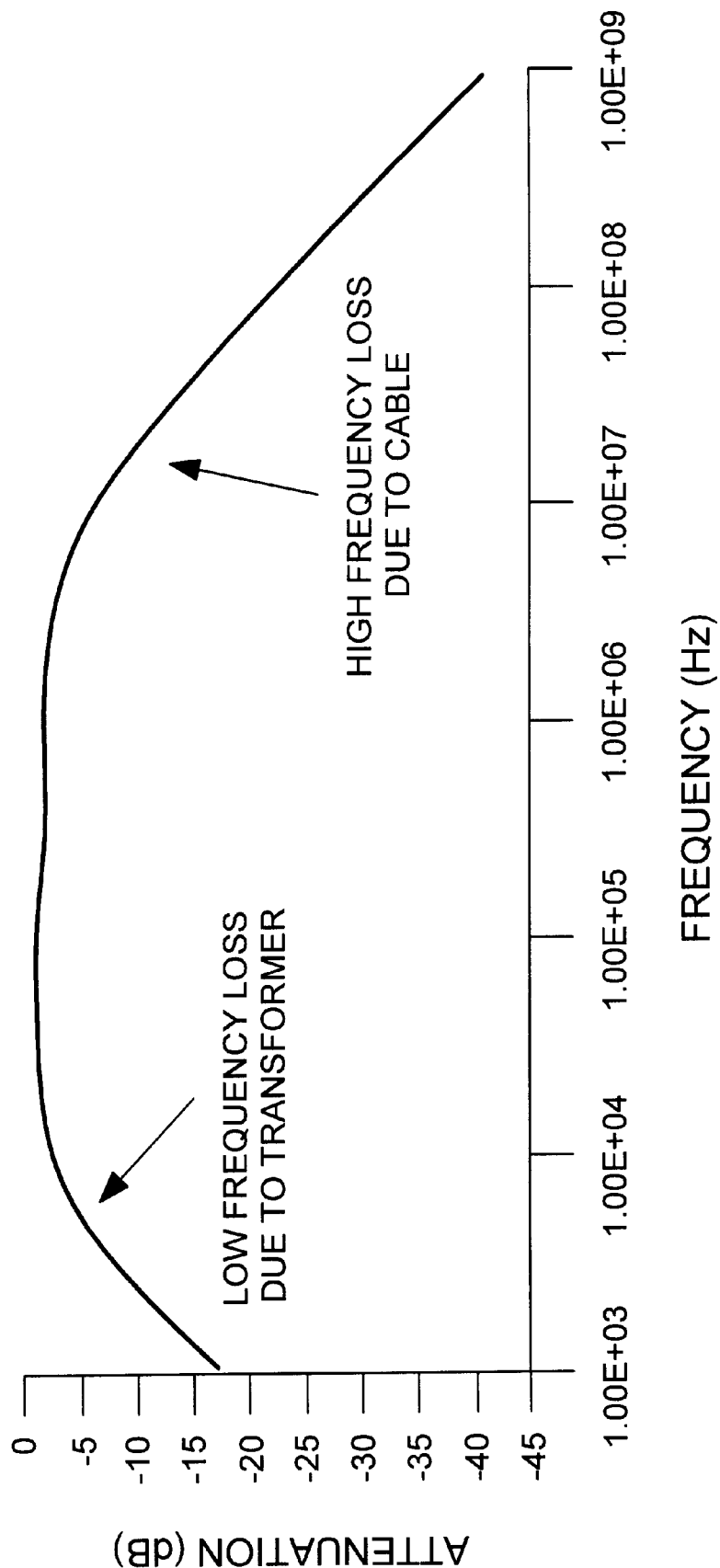

Turning first to FIG. 1A, a twisted pair of copper wires 1 is shown, at one end 3 of which a data signal is applied, e.g. at 60 MHz. The wires terminate at a receiver 5, which applies the signal through an isolation transformer, not shown, as a positive-going Vin+ and negative-going Vin− (with respect to a common, or zero value) signal to an equalizer 7. Without an equalizer, the signal transfer characteristics of the pair of wires would be typically as shown in FIG. 2, the low frequency attenuation being primarily due to the transformer, and the high frequency attenuation being primarily due to the cable. As may be seen, at about 60 MHz the signal would be about 15 dB down from its maximum amplitude, for a typical category 5 unshielded twisted pair (UTP) cable.

Figure 1B:
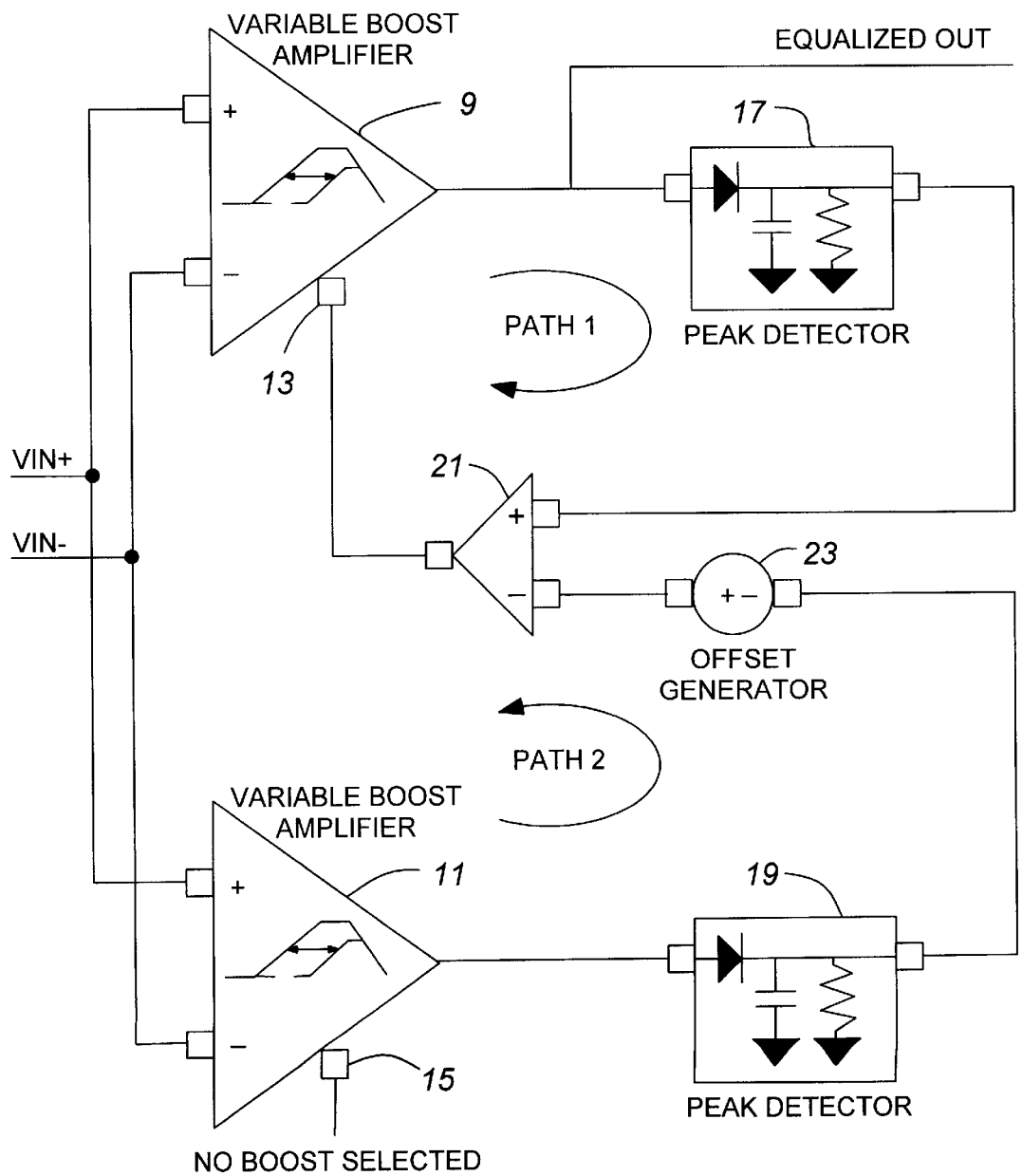

An embodiment of the equalizer which is the subject of the present invention, is shown in FIG. 1B.

The equalizer is comprised of a pair of variable boost amplifiers 9 and 11, each having a + and − input, with the corresponding inputs connected in parallel. The Vin+ signal is applied to the + inputs and the − signal is applied to the − inputs of the amplifiers 9 and 10, that is, for a balanced pair of wires, one wire is connected to the + inputs and the other wire is connected to the − inputs.

The amplifiers 9 and 11 are variable high-pass filters with amplification, wherein the high-pass filters' zeros locations are controlled by a control signal. A control inputs to the amplifiers are shown as inputs 13 and 15 respectively.

The output signal of amplifier 9 is applied to the input of a peak detector 17, and the output signal of amplifier 11 is applied to the input of a peak detector 19. The output signal of peak detector 17 is applied to an input of differential amplifier 21. The output signal of peak detector 19 is applied to another input of differential amplifier 21, after being modified by an offset. The offset can be provided by an offset generator 23, e.g. a simple fixed DC signal generator, serially connected in the signal path between the output of peak detector 19 and the corresponding input of differential amplifier 21. Amplifier 21 can be a simple amplifier providing high DC gain.

An output signal from the equalizer is obtained at the output of amplifier 9.

In accordance with one embodiment, the control signal applied to control input 15 is fixed. In another embodiment this signal can be varied. The description to immediately follow assumes that the signal applied to control input 15 is fixed, the output signal from amplifier 11 being thus dependent on the input signal, and not on a variable feedback control signal.

It may be seen that the output circuits of the two amplifiers provide two loops, the loop indicated in FIG. 1B as Path 1 being a closed loop (having negative feedback), and the loop indicated as Path 2 being an open loop.

It will be recognized that a filter can be expressed as having poles and zeros to express its transfer characteristics with frequency. Since the closed loop involving amplifier 9 has its zero(s) as dependent variable(s), the loop Path 1 can only adjust its high frequency characteristics in response to the error signal applied to control input 13 of amplifier 9. The error signal is the difference between the peaks of the variable boost Path 1 and the fixed reference path defined by Path 2.

Path 2 is an open loop reference path which extracts the peak amplitude from the output of amplifier 11. The fixed control signal applied to amplifier 11 renders its variable boost minimized, i.e. its zero(s) have been pushed to infinity. Thus amplifier 11 only provides a broadband flat gain within its passband.

However, the peak amplitude from output from peak detector 19 is offset by offset generator 23, the resulting output of which is applied to an input of the (error) differential amplifier 21.

The pole and zero locations of the variable boost amplifiers 9 and 11 can be set from an understanding of the loss characteristics of the signal carrying medium (e.g. twisted copper pair of wires). Because the adaptive circuit tries to build up the peak amplitude in Path 1, the pole/zero locations of the filter characteristics should be chosen such that the final zero in the variable boost amplifier 9 is slightly lower in frequency than that required for nominal equalization of the medium.

With appropriate attention to loop stability and dynamic behavior, the adaptive loop will equalize the medium with only a small amount of overshoot.

Figure 3:
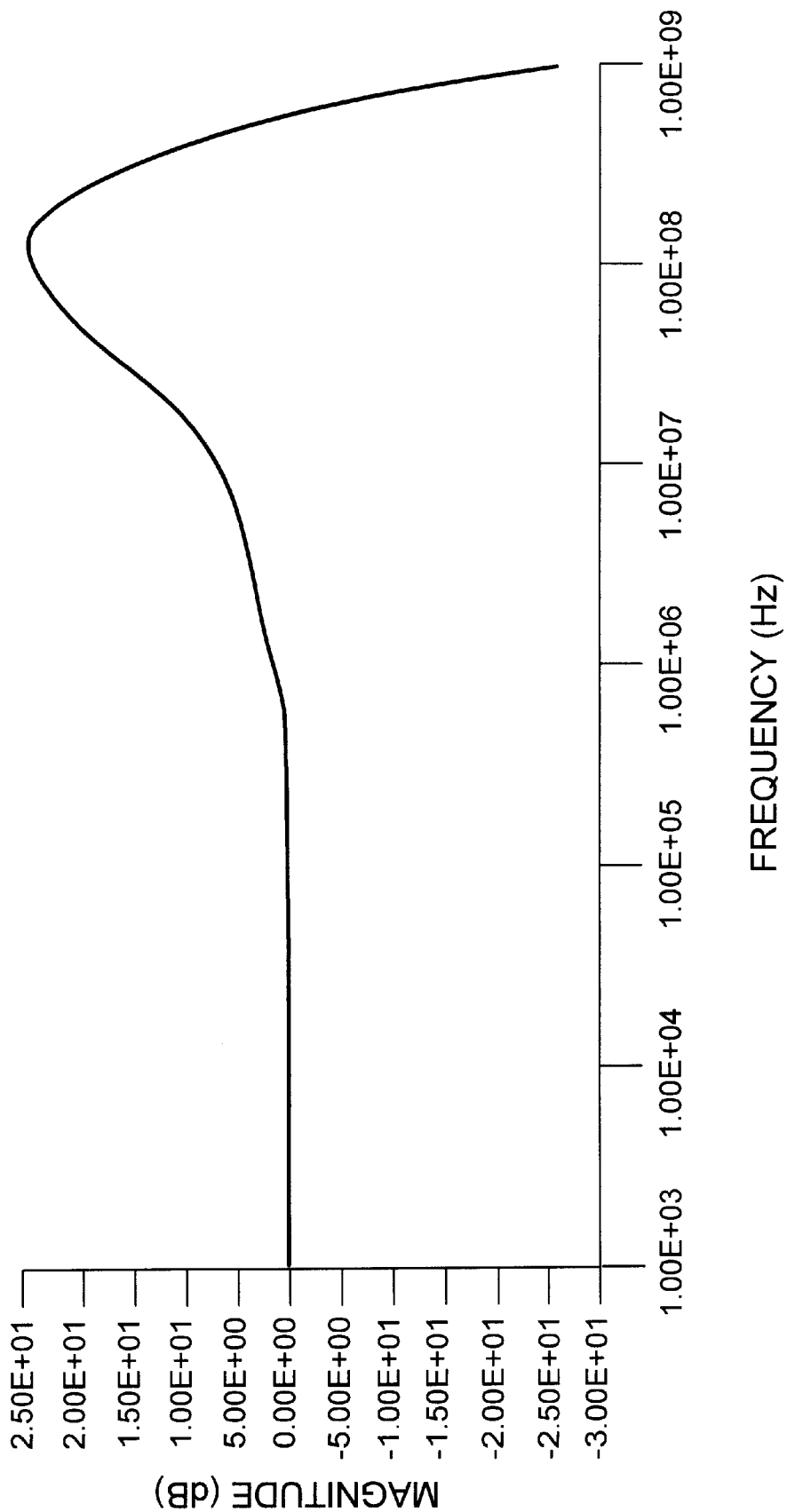
Figure 4:
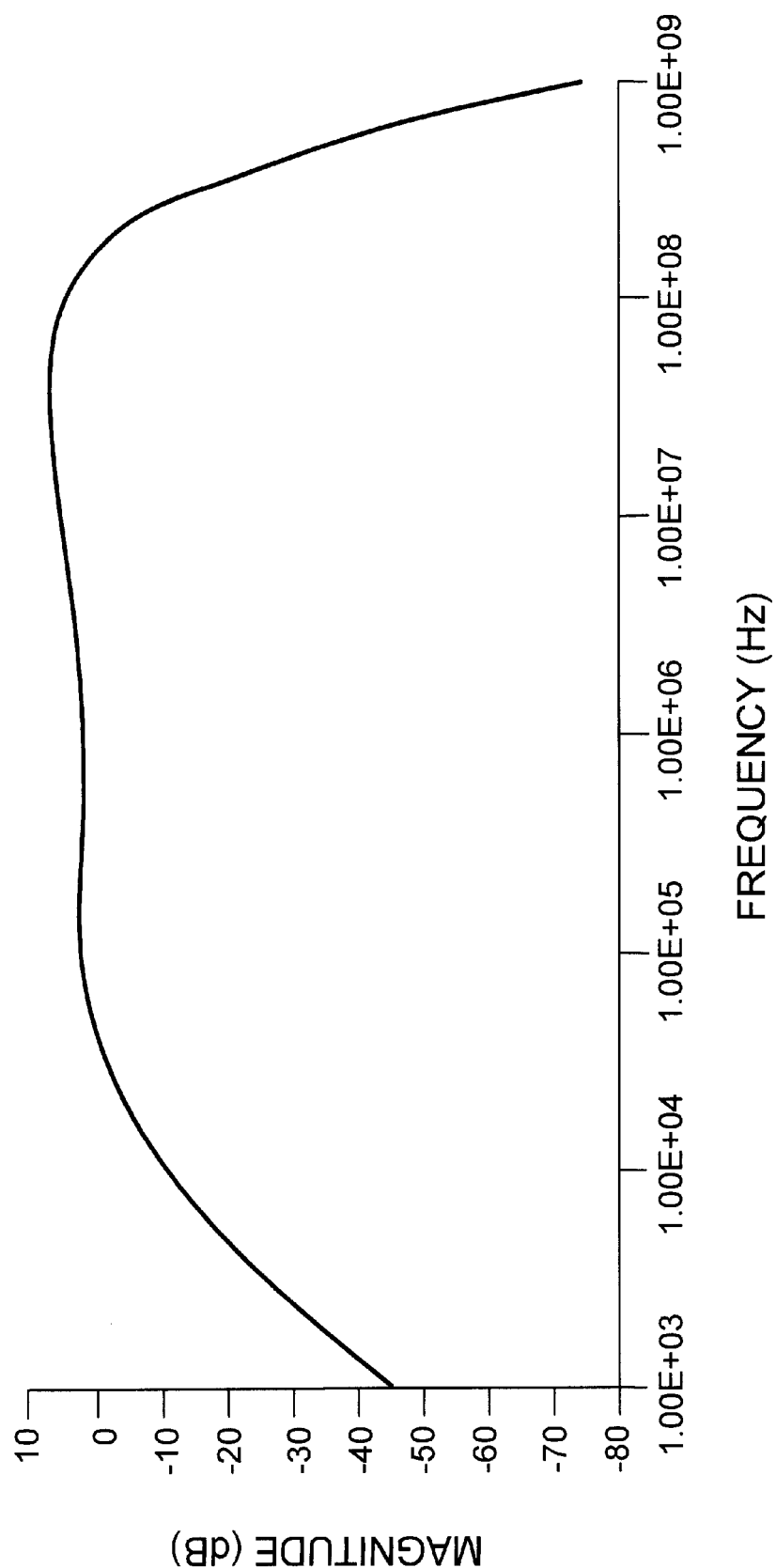

A typical plot of the frequency response of 100 meters of Category-5 unshielded twisted pair (UTP-5) cable used in high-speed data communications networks is shown in FIG. 2. A typical equalizer response to a cable having the loss characteristics shown in FIG. 2 is shown in FIG. 3. Note the compensation increase in amplitude at higher frequencies. The overall response of the data communications channel comprising the cable and the equalizer is shown in FIG. 4. A small peaking of the response at the higher frequencies, caused by the aforenoted overshoot, can be seen.

It should be noted that below the frequency of the boost zero(s), both Path 1 and Path 2 have identical responses, and therefore they react identically to low frequency transients such as baseline wander. This represents an important achievement of the invention, which results in a common-mode signal at the input to differential amplifier 21 (resulting in no error signal), which should be selected for high common-mode rejection. This ideally eliminates the sensitivity of the adaptive loop to baseline wander components.

The present invention also advantageously extracts the reference signal from the input signal. Thus the invention is independent of the absolute input signal level. This immunity to signal amplitudes allows for robust adaptive equalization under extreme amplitude tolerances.

The invention is also robust when receiver baseline wander restoration is employed which can distort the signal amplitude because of accuracy problems caused by implementation of the restoration. The complexity and required precision of the baseline wander restoration circuitry can thus be greatly reduced.

It has also been found that the acquisition rate of this invention from a zero signal amplitude state (i.e. null input state) is high. In many prior art adaptive equalizers, the error signal applied to the error amplifier can be extremely large when the input data signals are not present. This is due in part to the adaptive method used in the prior art being based on a fixed reference and there being no detectable peak.

In practical implementations of the error amplifier used in the prior art systems, the error amplifier is fully limited and does not act as a signal amplifier. Therefore such systems are open looped with maximum equalization being applied. On the onset of non-zero input signal amplitude, such systems remain at maximum equalization until the error amplifier exits its limit mode. The acquisition rate from the null input state is finite and proportional to the peak detector's behavior and the closed loop dynamics of the adaptive loop. The peak detector acts as a peak integrator and will take time to capture a change in peak information. Only until after the peak detector has brought the error signal within the range of the amplifier can the adaptive closed loop begin its acquisition.

The present invention on the other hand limits the absolute error voltage seen by the error amplifier 21 during the null input state to a value equal to the offset reference caused by offset generator 23. For an arbitrary error voltage limit threshold on the amplifier, this invention will exit the limit state much sooner than the prior art system would. Indeed, the system can be designed so that amplifier 21 never enters the limit mode, which results in a much improved acquisition rate.

It was noted earlier that the offset provided by offset generator 23 is fixed in accordance with one embodiment. However, this offset need not be constant. In an alternative embodiment of the invention, the offset can vary as a function of a design and/or system parameter. For instance if the invention were employed in an application in which more than one type of cable plant were expected, the offset magnitude can be programmed to offer a variation in the equalizer's frequency response which better compensates for the cable's loss characteristics.

In accordance with another embodiment that can be used in applications wherein multiple line codes are required to be supported, it will be noted that different line codes may have varied tolerances to overshoot (over-equalization). Different values of offset can be utilized to provide optimization of the medium for different line codes.

In another embodiment of the invention, the offset generator can be located elsewhere in Path 2 than as shown in FIG. 1B. Actual location of the offset application is not functionally important, as long as the net effect is to induce an offset in the open loop, so as to provide a reference against which the signal applied from Path 1 to an input of amplifier 21 can be subtracted.

A person understanding this invention may now conceive of alternative structures and embodiments or variations of the above. All those which fall within the scope of the claims appended hereto are considered to be part of the present invention.

I claim:

1. An equalizer comprising:
   (a) a pair of high pass filters for receiving an input signal, each filter having gain, a first of the filters having gain which is substantially flat within its passband, a second of the filters having gain over a range of its passband which is controlled by an error signal,
   (b) a differential amplifier for generating the error signal, having an output applied to a control input of the second filter,
   (c) a pair of broadband amplitude peak detectors each for receiving an output signal of a respective one of said filters,
   (d) means for applying loop signals derived from outputs of the filters and passing though the peak detectors to corresponding inputs of the differential amplifier,
   (e) means for providing an offset to a loop signal derived from the output of the first filter, and
   (f) means for providing an output signal from the output of the second filter.

2. An equalizer as defined in claim 1 in which the offset is variable.

3. An equalizer as defined in claim 1 in which the offset is fixed.

4. An equalizer as defined in claim 3 in which the offset providing means is comprised of means for applying a fixed voltage boost to the loop signal derived from the output of the first filter.

5. An equalizer as defined in claim 4 in which the offset generator is a fixed voltage generator in series between an output of the peak detector passing the loop signal derived from the first filter, and an input of the differential amplifier.

6. An equalizer comprising:
   (a) a pair of variable boost amplifiers, both for receiving an input signal,
   (b) a pair of circuit paths connected to respective outputs of the amplifiers, including means for acquiring signal amplitudes of output signals from the amplifiers,
   (c) a differential amplifier for receiving said amplitudes at respective inputs thereof, and for providing an error signal to a gain control input of one of the amplifiers for controlling high frequency gain of said of the amplifiers,
   (d) means for providing an offset to one of said amplitudes, and
   (e) means for providing an output signal from the output of said one of the amplifiers.

7. An equalizer as defined in claim 6 in which gain of the other of the amplifiers is fixed.

8. An equalizer as defined in claim 7 in which the offset is a fixed voltage.

9. An equalizer as defined in claim 7 in which the offset is a fixed boost to said one of the amplitudes.

10. A method of equalizing comprising applying an error signal to one of a pair of amplifiers having similar high pass bandwidths and which carry a similar input signal, for controlling high frequency gain of said one of the amplifiers, the error signal being derived by subtracting an amplitude value of a signal output from said one of the amplifiers and an offset amplitude value of a signal output from another of the amplifiers, and obtaining an output signal from said one of the amplifiers.

11. A method as defined in claim 10 including maintaining gain of said another of the amplifiers substantially the same over a substantial range of its bandwidth.

* * * * *